United States Patent [19]

Gercekci

[11] 4,394,750

[45] Jul. 19, 1983

[54] PROM ERASE DETECTOR

[75] Inventor: Anil Gercekci, Geneva, Switzerland

[73] Assignee: Motorola, Inc., Schaumburg, Ill.

[21] Appl. No.: 282,196

[22] Filed: Jul. 10, 1981

[51] Int. Cl.³ ............................................ G11C 11/40
[52] U.S. Cl. .................................................. 365/218
[58] Field of Search ................... 365/94, 95, 103, 104, 365/184, 201, 218, 189

[56] References Cited

U.S. PATENT DOCUMENTS 4,279,024 7/1981 Schrenk .......................... 365/218 X Primary Examiner—Joseph A. Popek
Attorney, Agent, or Firm—Joe E. Barbee

[57] ABSTRACT

A programmable transistor is provided adjacent to a programmable read only memory. A latch is used in conjunction with the programmable transistor and data is written into the latch. If the programmable transistor is programmed the output of the latch will be modified, however, if the programmable transistor is not programmed the output of the latch will not be modified when it is read. The programming pads used to program the programmable transistor are severed so they are no longer functional once the programmable transistor has been programmed. Therefore if someone erases the programmable read only meory the programmable transistor is also erased and cannot be reprogrammed.

8 Claims, 2 Drawing Figures

PROM ERASE DETECTOR

BACKGROUND OF THE INVENTION

This invention relates, in general, to programmable read only memories (PROM) and more particularly, to an erase detector for those programmable read only memories which are eraseable.

Read only memories are well known and widely used in digital systems. More recently, programmable read only memories (PROM) have come into use. Some of these memories are programmable by the use of high voltage to program a predetermined cell within the memory after the memory is made. The programmed memories can also be altered or erased. Some times the erasure is accomplished by exposure to radiation such as ultraviolet radiation.

One of the conveniences of this type of memory is that it can be programmed after it is manufactured instead of requiring programming by a mask operation during the manufacturing process. Many times once the memory is programmed it is desirable to maintain the program without modifications, and in such cases it is important to determine whether the data within the memory has been tampered with, altered, or erased.

Accordingly, it is an object of the present invention to provide a new and improved erase detector for a programmable read only memory.

Another object of the present invention is to provide a method for detecting whether a programmable read only memory has been erased.

Yet a further object of the present invention is to provide a substantially fool-proof circuit for determining whether a programmable read only memory has been erased.

SUMMARY OF THE INVENTION

The above and other objects and advantages of the present invention are accomplished by the use of a latch in conjunction with a programmable transistor. The output of the latch is coupled to the control electrode of a switching transistor. The switching transistor and a programmable transistor are connected in series to form a node therebetween. The latch is controllably coupled to a data bus so that the latch can be programmed from the bus. The node is coupled to an amplifier that provides an output which is controllably coupled to the bus. The programmable transistor is located near the programmable read only memory. Before the programmable transistor is programmed the output of the amplifier does not change state; however, when the programmable transistor is programmed the output of the amplifier is controlled by data stored in the latch. Then if the memory is erased, the programmable transistor assumes its unprogrammed state.

DETAILED DESCRIPTION OF THE DRAWINGS

Figure 1:
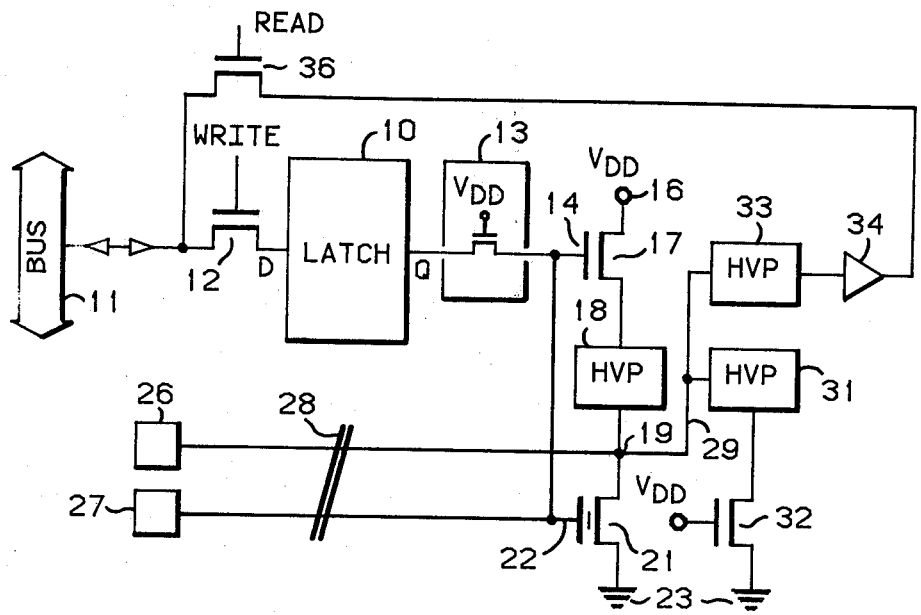
FIG. 1 illustrates the invention in one form thereof.

Latch 10 has its D input controllably coupled to data bus 11 by transistor 12. Transistor 12 is controlled by a write signal which is generated by a processor unit associated with the programmable read only memory (PROM) near which the circuitry of FIG. 1 is located. The output Q of latch 10 is coupled by high voltage protection circuit 13 to gate electrodes 14 and 22 of transistors 17 and 21 respectively. Transistor 21 is a programmable transistor and can be identical to the programmable transistors located in the programmable read only memory. The drain of transistor 17 is connected to a voltage terminal 16 which receives voltage $V_{DD}$. The source electrode of transistor 17 is coupled by high voltage protection circuit 18 to node 19. Transistor 21 has its drain electrode connected to node 19 and has its source electrode connected to a reference terminal 23 illustrated as ground. Programming pads 26 and 27 are coupled to node 19 and to control electrode 22 respectively.

In a preferred embodiment, programming pads 26 and 27 are severed from node 19 and electrode 22 respectively. Lines 28 illustrate means for severing programming pads 26 and 27. These programming pads can be severed by laser burning of the connecting lines, by having fusible links within the lines at 28 which are destroyed once transistor 22 is programmed, or the connecting lines can be severed during scribing. It is well known by those persons of skill in the art that a plurality of integrated circuits are made on one wafer. Scribe lines are used between the integrated circuits to weaken the wafer so that the wafer can be broken or cut along the scribe lines thereby separating the plurality of integrated circuits. In the present invention if the scribe line is used to sever programming pads 26 and 27 from node 19 and control electrode 22 then the connecting lines must extend across the scribe line adjacent to the integrated circuit on which transistor 21 is located. A certain critical code can be entered in the PROM during wafer test and then the connecting lines will be severed during separation of the integrated circuit containing transistor 21 from the wafer.

Node 19 is coupled to transistor 32 and to amplifier 34 by high voltage protection circuits 31 and 33 respectively. Transistor 32 has its control electrode connected to voltage $V_{DD}$ its source connected to voltage terminal 23, and its drain electrode coupled to sense line 29 by high voltage protection circuit 31. Line 29 is coupled to the input of amplifier 34 by high voltage protection circuit 33. The output of amplifier 34 is coupled to data bus 11 by transistor 36. Transistor 36 is controlled by a read signal which is generated by the associated processor.

High voltage protection circuits 13, 18, 31 and 33 are all identical, and in a preferred embodiment, have one transistor whose control electrode is connected to voltage $V_{DD}$. The arrangement of this single transistor is illustrated in conjunction with high voltage protection circuit 13. The purpose of the high voltage protection circuits is to keep the programming voltage applied to transistor 21 from damaging PN regions of the other devices. The other devices include transistors 17 and 32, latch 10 transistors, and amplifier 34 transistors. The failure mode is breakdown caused by very high electric fields on the depletion region between the P and N junction of the field effect transistors.

Latch 10, in a preferred embodiment, includes two series connected inverters with the first inverter having its input connected to D, its output connected to the input of the second inverter and the second inverter having its output connected to Q. A feedback path is then supplied from the output Q to the input D by any suitable means such as by a feedback resistor or the like.

Before transistor 21 is programmed, and assuming latch 10 is providing a zero logic level at its Q output, transistors 17 and 21 will be in a nonconducting state since the zero logic level is not high enough to overcome the threshold voltage of transistors 17 and 21. Node 19 and sense line 29 will then be held to a zero logic level by transistor 32. Transistor 32 is to prevent sense line 29 from floating when transistor 17 and 21 are nonconducting. If the output Q of latch 10 is a logic level 1 then both transistors 17 and 21 will be conductive. However, when transistors 21 is unprogrammed it will exhibit a much lower impedance than does transistor 17 and transistor 32 will exhibit a much higher impedance than does transistor 17. With transistors 17 and 21 both conducting, transistor 21 will tend to pull node 19 towards ground which is the lowest potential in the circuit and corresponds to a logic level 0 which is coupled to amplifier 34. The output of amplifier 34 is coupled back to bus 11 by transistor 36. In summary, when transistor 21 is unprogrammed the output of amplifier 34 will remain at a logic level 0 regardless of the output of latch 10.

Transistor 21 can be programmed by applying a high voltage at programming pads 26 and 27. This voltage can be in the order of 20 to 25 volts and will cause the threshold of transistor 21 to change from approximately 2 volts to some value above the normal supply voltage, $V_{DD}$. Therefore, when a typical logic level 1 is applied to control electrode 22 transistor 21 will not be enabled. However, a logic level 1 will cause transistor 17 to be enabled which causes node 19 to rise to a logic level 1 which is amplified by amplifier 34 and coupled back to data bus 11. When latch 10 provides a logic level 0 output transistor 17 is not enabled nor is transistor 21. In this case transistor 32 will maintain sense line 29 and node 19 at a logic low level which will be amplified by amplifier 34 and coupled to data bus 11. Therefore when transistor 21 is programmed the output of latch 10 is reflected at node 19 and coupled by amplifier 34 to data bus 11.

Once transistor 21 becomes programmed it will always be in an "off" or non-conducting state and will exhibit a much higher impedance than does transistor 32, and it is noted hereinbefore that transistor 32 exhibits a higher impedance than does transistor 17. In a preferred embodiment, the drain of transistor 21 as well as sense line 29 are made in the diffusion of the integrated circuit and the diffusion is covered by metal lines. This affords a greater protection to the integrity of transistor 21 by making it almost impossible for someone to program transistor 21 by probing down to node 19 or sense line 29.

Also provided is a method of detecting when a PROM is erased. As an example, transistor 21 is placed adjacent to a PROM and if someone attempts to erase the PROM by providing a mask over all the circuitry (except the PROM) to protect the circuitry outside the PROM from being bombarded with radiation, transistor 21 will still be erased, since in a typical configuration the transistor as well as the PROM are covered by a layer of silicon dioxide which in turn has a passivation layer on top of it. Therefore as the radiation penetrates through the passiviation layer and the silicon dioxide to reach the PROM it begins to bounce back and forth between the passivation layer and the silicon substrate and travels beneath the mask to the programmable transistor thereby unprogramming or erasing it also. This mechanism is commonly called total internal reflection.

Figure 2:
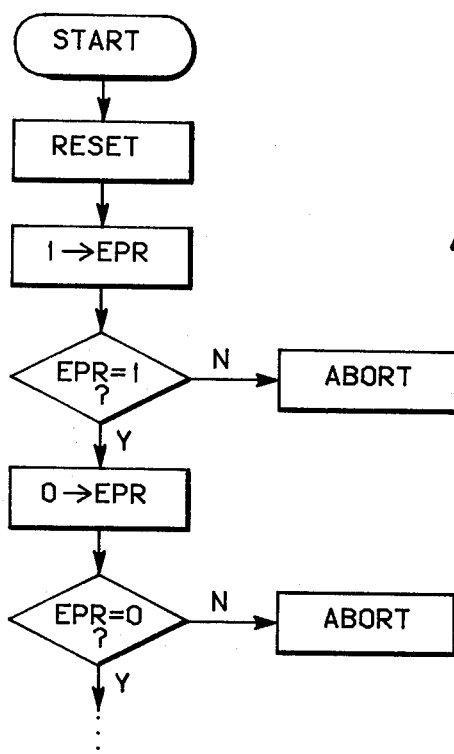
FIG. 2 illustrates a flow diagram of a method of how the erase detector circuit is interrogated.

Once a desired code is entered into the PROM and programmable transistor 21 is programmed the memory is then ready for use in a system. Each time before a program is executed using the PROM a check can be made to determine whether the PROM has been erased or not. A flowchart for this check is illustrated in FIG. 2. At the start of the program the circuitry is reset. A logic level 1 is then read into the erase protection (EPR) latch (illustrated as latch 10 in FIG. 1). The output of the latch is then read and if the logic level read is not a logic level 1 the program can be aborted, however, if a logic level 1 is read then a zero will be written into the erase protection latch and an attempt will be made to read this logic level 0. If a logic level 0 is not read the program will be aborted but if a logic level 0 is read then the program shall continue. This procedure will also detect the case where a potential defrauder hardwires the output of amplifier 34 in an attempt to bypass the security afforded by the erase detection circuit.

By now it should be appreciated that there has been provided an erase detector circuit for a PROM which requires only one programmable transistor and is virtually tamper proof.

I claim:

1. A programmable read only memory having an erase detector to detect when the memory has been erased and having a data bus, the erase detector comprising: latch means having an input and an output, the input being coupled to the data bus; a first transistor being controllable by the output of the latch means; a memory cell coupled in series with the first transistor and having a control input coupled to the output of the latch means, the memory cell and first transistor forming an output node therebetween; and means for coupling the output node to the data bus.

2. The programmable read only memory of claim 1 wherein the means for coupling includes an amplifier.

3. The programmable read only memory of claim 1 further including a second transistor coupled in parallel with the memory cell to maintain the output node of the series coupled first transistor and memory cell at a predetermined logic level when the output of the latch means is at a first logic level.

4. The programmable read only memory of claim 1 further having protection means to protect the first transistor, the latch means and the means for coupling from a high voltage used to program the memory cell.

5. A method for detecting erasure of a programmable read only memory, comprising: providing latching means for storing a data bit; providing a programmable memory cell adjacent to the programmable read only memory, the programmable memory cell being coupled to an output of the latching means and providing a predetermined state in response to the data bit stored in the latching means when the memory cell is not programmed and providing the state stored in the latching means when the memory cell is programmed; and disabling programming pads to the programmable memory cell after the memory cell has been programmed so that if the programmable read only memory is erased, the memory cell is erased also and the latching means will then read out only the predetermined state thereby indicating the programmable read only memory has been erased.

6. A programmable read only memory having a data bus and an erase detector to detect when the programmable read only memory is erased, the erase detector comprising: latching means for storing data; a first controllable coupler coupled between the latching means and the data bus; a first transistor having a control electrode coupled to the latching means; a second transistor coupled to the first transistor and having a programmable threshold, the second transistor having a control electrode coupled to the latching means, and forming a node between the first and second transistors; a first severable programming pad coupled to the control electrode of the second transistor; a second severable programming pad coupled to the node formed between the first and second transistors; first high voltage protection means coupled between the control electrode of the second transistor and the latching means; second high voltage protection means coupled between the node and the first transistor; means for amplifying coupled to the node and providing an output; a second controllable coupling means coupled between the output of the means for amplifying and the data bus; and third high voltage protection means coupled between the node and the means for amplifying.

7. The programmable read only memory of claim 6 further including a third transistor coupled to the node and a fourth high voltage protection means coupled between the third transistor and the node.

8. The programmable read only memory of claim 7 wherein each of the first, second, third, and fourth high voltage protection means is a transistor having its control electrode coupled to a drain voltage used for the memory.

* * * * *